US010136541B2

(12) United States Patent
Rhee

(10) Patent No.: US 10,136,541 B2
(45) Date of Patent: Nov. 20, 2018

(54) ELECTRONIC DEVICE

(71) Applicant: Samsung Electronics Co., ltd., Gyeonggi-do (KR)

(72) Inventor: Bong-Jae Rhee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 111 days.

(21) Appl. No.: 14/329,562

(22) Filed: Jul. 11, 2014

(65) Prior Publication Data

US 2015/0014051 A1  Jan. 15, 2015

(30) Foreign Application Priority Data

Jul. 12, 2013 (KR) ........................ 10-2013-0082216

(51) Int. Cl.
| | |
|---|---|
| H05K 1/14 | (2006.01) |
| H05K 7/14 | (2006.01) |
| H01R 13/52 | (2006.01) |
| H04M 1/02 | (2006.01) |
| H05K 5/02 | (2006.01) |
| H05K 5/03 | (2006.01) |
| H05K 1/11 | (2006.01) |

(52) U.S. Cl.
CPC ....... H05K 7/1427 (2013.01); H01R 13/5213 (2013.01); H04M 1/0274 (2013.01); H05K 5/0291 (2013.01); H05K 5/03 (2013.01); H05K 1/116 (2013.01); H05K 2201/10159 (2013.01)

(58) Field of Classification Search
CPC ............ H05K 1/116; H05K 5/02; H05K 5/03; H05K 5/0291; H05K 7/14; H05K 7/1427; H05K 2201/10159; H01R 13/5213; H04M 1/0274; G06F 1/16; G06F 1/18; G06F 1/26; G06F 1/1626; G06F 1/1635; G06F 1/1643; G06F 1/1656; G06F 17/21; G06F 2200/1632
USPC .......... 174/520; 361/736, 727, 679.09, 616; 312/291, 223.2, 292; 439/142
See application file for complete search history.

(56) References Cited

U.S. PATENT DOCUMENTS 4,868,387 A * 9/1989 Yamada ................ G01T 1/2016
                                                250/588
5,574,625 A * 11/1996 Ohgami ................ G06F 1/1626
                                                312/223.2

(Continued)

FOREIGN PATENT DOCUMENTS

JP          H 07168648         7/1995

OTHER PUBLICATIONS

Extended European Search Report dated Nov. 24, 2014 in connection with European Patent Application No. 14176450.6; 6 pages.

Primary Examiner — Timothy Thompson
Assistant Examiner — Guillermo Egoavil

(57) ABSTRACT

An electronic device includes a Printed Circuit Board (PCB), a housing, an inner cover, and an outer cover. The PCB mounts a first socket and a second socket thereon. The housing includes a first slot disposed to correspond to the first socket and a second slot disposed to correspond to the second socket. The housing receives the PCB. The inner cover opens/closes the first slot. The outer cover opens/closes the second slot. The first socket and the second socket are open toward the first slot and the second slot, respectively. When the outer cover is open, the inner cover is exposed and is in an openable state.

17 Claims, 14 Drawing Sheets

(56) References Cited

U.S. PATENT DOCUMENTS

| | | | | |
|---|---|---|---|---|
| 5,663,867 A | * | 9/1997 | Honda | G06F 1/1616 |
| | | | | 361/679.32 |
| 2005/0098768 A1 | * | 5/2005 | Malek | B66C 15/065 |
| | | | | 254/267 |
| 2005/0142934 A1 | | 6/2005 | Cheng | |
| 2006/0250778 A1 | | 11/2006 | Yamamoto | |
| 2007/0059985 A1 | | 3/2007 | Ting | |
| 2008/0299829 A1 | | 12/2008 | Kim | |
| 2011/0298969 A1 | * | 12/2011 | Lin | H05K 5/0239 |
| | | | | 348/373 |
| 2012/0056706 A1 | * | 3/2012 | Schafer | H01F 27/266 |
| | | | | 336/212 |
| 2014/0099809 A1 | * | 4/2014 | Hsu | H01R 13/635 |
| | | | | 439/159 |
| 2014/0307410 A1 | * | 10/2014 | Jung | H05K 1/0216 |
| | | | | 361/818 |

\* cited by examiner

ELECTRONIC DEVICE

PRIORITY

The present application is related to and claims the benefit under 35 U.S.C. § 119(a) of a Korean patent application filed in the Korean Intellectual Property Office on Jul. 12, 2013 and assigned Serial No. 10-20130082216, the entire disclosure of which is hereby incorporated by reference.

TECHNICAL FIELD

The present disclosure relates to an electronic device.

BACKGROUND

Currently, with development of an electronic communication industry, an electronic device such as a mobile communication terminal (cellular phone), an electronic scheduler, a Personal Digital Assistant (PDA), a Television (TV), a laptop computer, etc. has become a necessity of a modern society, and plays an important role of transferring information changing fast. This electronic device provides a convenient operation environment to a user via a Graphic User Interface (GUI) and provides various multimedia based on a web environment.

Recently, as a demand for an electronic device that lays an emphasis on portability increases, the electronic device is being brought to the market in a slimmer and lighter form, and improvement for space utilization is sought for.

SUMMARY

To address the above-discussed deficiencies, it is a primary object to provide an electronic device capable of mounting sockets for a plurality of memory cards on a Printed Circuit Board (PCB) by raising space utilization.

Another aspect of the present disclosure is to provide an electronic device capable of raising usability regarding memory card attachment/detachment by collecting and installing a plurality of sockets for memory cards in one place.

Still another aspect of the present disclosure is to provide an electronic device capable of preventing erroneous insertion of a memory card by installing a double cover that may open/close sockets of different kinds for memory cards.

In accordance with an aspect of the present disclosure, an electronic device is provided. The electronic device includes a Printed Circuit Board (PCB) mounting a first socket and a second socket thereon, a housing including a first slot disposed to correspond to the first socket and a second slot disposed to correspond to the second socket, and receiving the PCB, an inner cover for opening/closing the first slot, and an outer cover for opening/closing the second slot, wherein the first socket and the second socket are open toward the first slot and the second slot, respectively, and in the case where the outer cover is open, the inner cover is exposed and becomes an openable state.

In accordance with another aspect of the present disclosure, an electronic device is provided. The electronic device includes a Printed Circuit Board (PCB) mounting an upper socket and a lower socket of different kinds thereon, installed on an upper surface and a lower surface in proximity to a periphery, respectively, a housing including an upper slot disposed to correspond to the upper socket and a lower slot disposed to correspond to the lower socket in a lateral portion, and receiving the PCB, an inner cover rotatable to an outer direction of the housing elastic warp deformation of an extension portion coupled to the housing, and capable of opening/closing the upper slot, and an outer cover movable in a straight line by a predetermined distance to an outer direction of the housing by sliding movement of a shaft coupled to the housing, rotatable around the shaft such that the outer cover crosses a lateral portion of the housing, and capable of opening/closing the lower slot, wherein the upper socket and the lower socket are open toward the upper slot and the lower slot, respectively, in the case where both the inner cover and the outer cover are closed, the outer cover overlaps the inner cover and hides the inner cover, and in the case where the outer cover is opened, the inner cover is exposed and becomes an openable state.

The electronic device collects and disposes sockets of different kinds for a memory card in one place in order to raise usability, and may include a double cover capable of opening/closing the sockets of different kinds for the memory card. Since one cover is exposed to the outside, an appearance of the electronic device becomes elegant. Attachment/detachment of a plurality of memory cards are discriminated for a case of opening the outer cover and a case of opening both the outer cover and the inner cover, erroneous insertion of the memory cards may be prevented and usability may be raised.

Other aspects, advantages and salient features of the disclosure will become apparent to those skilled in the art from the following detailed description, which, taken in conjunction with the annexed drawings, discloses exemplary embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, like reference numerals will be understood to refer to like parts, components and structures.

DETAILED DESCRIPTION

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device. The following description with reference to the accompanying drawings is provided to assist in a comprehensive understanding of exemplary embodiments of the disclosure as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the disclosure. Also, descriptions of well-known functions and constructions are omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of exemplary embodiments of the present disclosure are provided for illustration purpose only and not for the purpose of limiting the disclosure as defined by the appended claims and their equivalents.

An exemplary embodiment of the present disclosure may mount a plurality of sockets for memory cards on a Printed Circuit Board (PCB) by raising space utilization. An exemplary embodiment of the present disclosure may raise space utilization of an electronic device by mounting sockets of different kinds for memory cards (ex: a SIM memory card, and an SD card) on the upper surface and the lower surface of a PCB such that they overlap each other. An exemplary embodiment of the present disclosure may raise usability regarding memory card attachment/detachment by collecting and installing a plurality of sockets for memory cards in one place. An exemplary embodiment of the present disclosure may open/close a plurality of sockets for memory cards and reduce the number of covers exposed to the outside. An exemplary embodiment of the present disclosure may prevent erroneous insertion of a memory card by installing a double cover capable of opening/closing sockets of different kinds for memory cards. An exemplary embodiment of the present disclosure may prevent erroneous insertion of a memory card via a method of opening only one socket for a memory card in case of opening an outer cover, and opening the other socket for a memory card too in case of additionally opening an inner cover.

Figure 1:
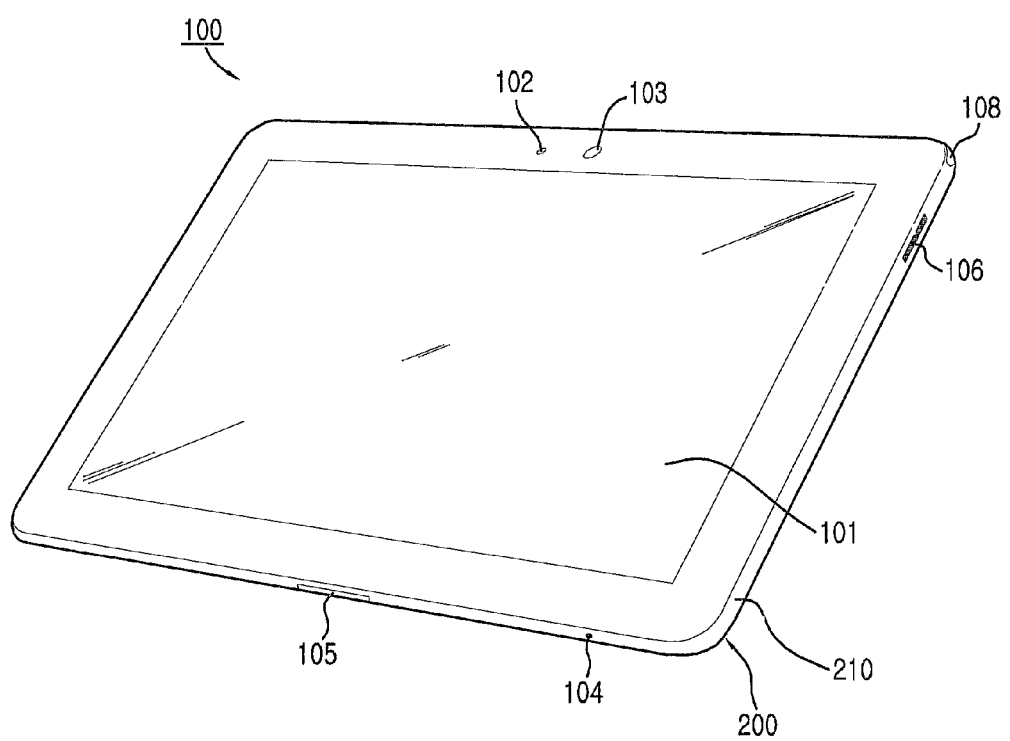
FIGS. 1 and 2 illustrate perspective views of an electronic device according to an embodiment of the present disclosure.
Figure 2:
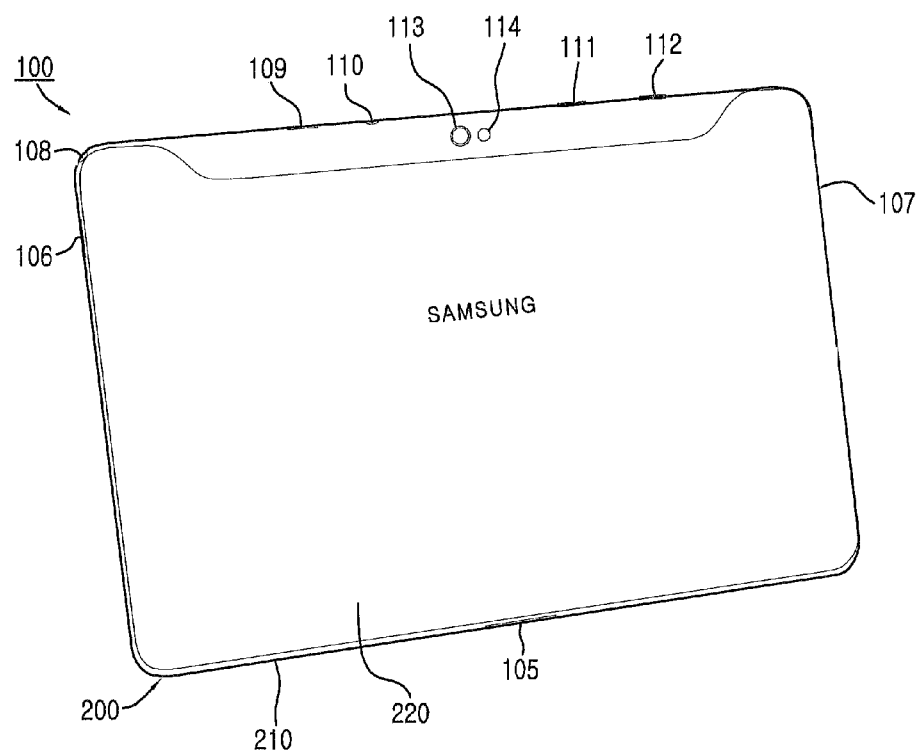

FIGS. 1 and 2 illustrate perspective views of an electronic device according to an embodiment of the present disclosure.

Referring to FIGS. 1 and 2, a touchscreen 101 for displaying an image and receiving a touch input, an illuminance sensor 102 for measuring brightness, and a camera 103 for shooting may be mounted on the front side of the electronic device 100. A microphone 104 for converting a sound to an electric signal, and a port 105 for Universal Serial Bus (USB) connection and charging may be mounted on the lower end of the electronic device 100. Speakers 106 and 107 for outputting an electric signal in the form of sounds may be mounted on both side ends of the electronic device 100, respectively. An antenna 108 for Digital Multimedia Broadcasting (DMB) may be mounted on the right upper end of the electronic device 100. This antenna 108 may be drawn out and stretched to the outside. A double cover (not shown) for opening/closing sockets capable of attaching/detaching memory cards of different kinds (ex: Subscriber Identity Module (SIM) card and a Secure Digital (SD) card) may be mounted on the upper end of the electronic device 100. For example, in case of opening an outer cover, a socket for one memory card is opened, and in case of opening both the outer cover and an inner cover, a socket for the other memory card may be additionally opened. A button 111 for controlling a volume may be mounted on the upper end of the electronic device 100. A button 112 for turning on/off power may be mounted on the upper end of the electronic device 100. A camera 113 for shooting and a flash 114 for shooting may be mounted on the upper end of the electronic device 100. The electronic device 100 may include a housing 200 forming an appearance and receiving electronic parts. The housing 200 may include a front housing 210 disposed in the front of the electronic device 100, and a rear housing 220 disposed in the rear of the electronic device 100. The sockets for the memory cards communicate with an opening (not shown) formed in the housing 200, and the double cover (not shown) may be opened and closed to open/close the opening of the housing 200.

Figure 3:
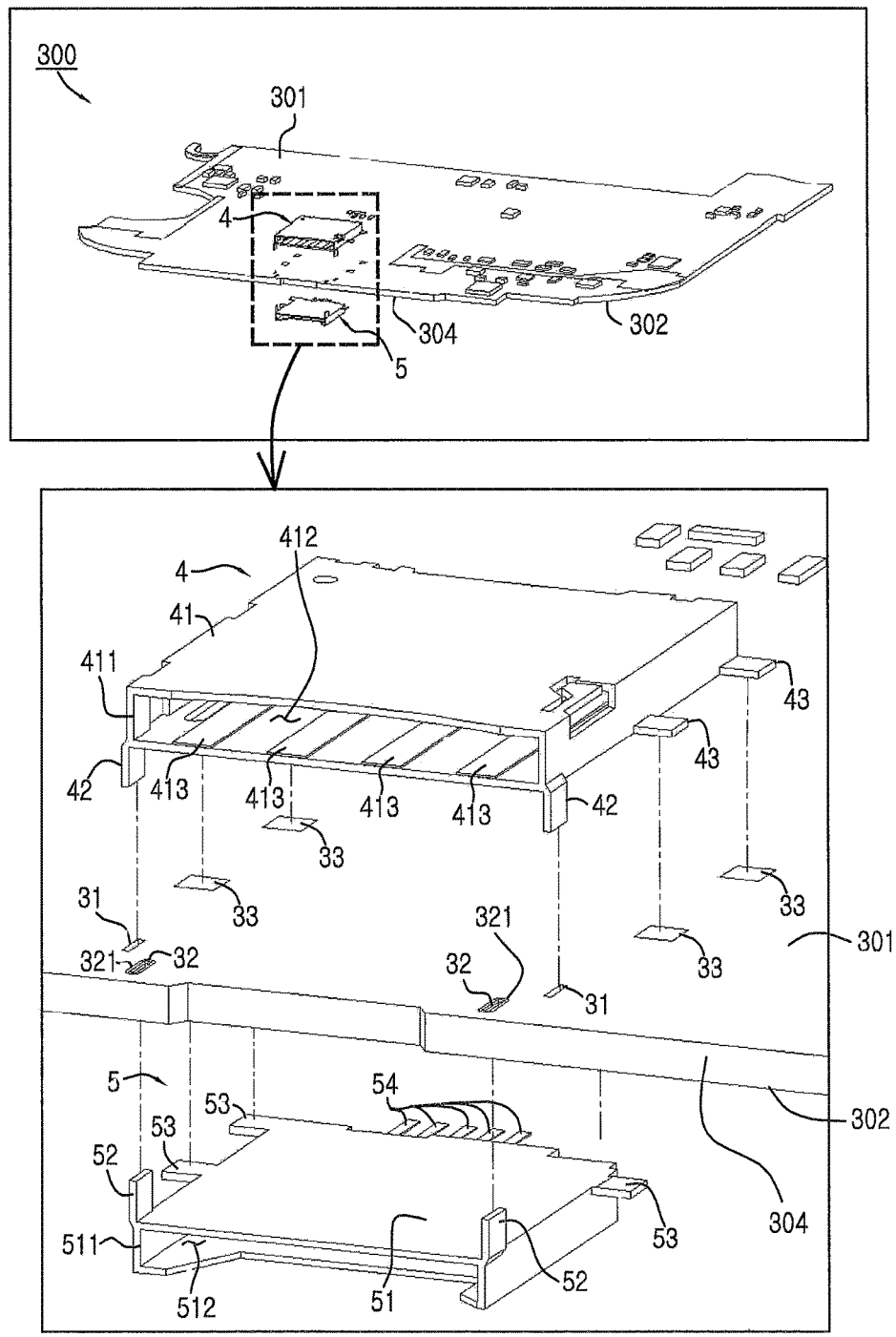
FIG. 3 illustrates a perspective view of a PCB and sockets for memory cards are separated according to an embodiment of the present disclosure.
Figure 4:
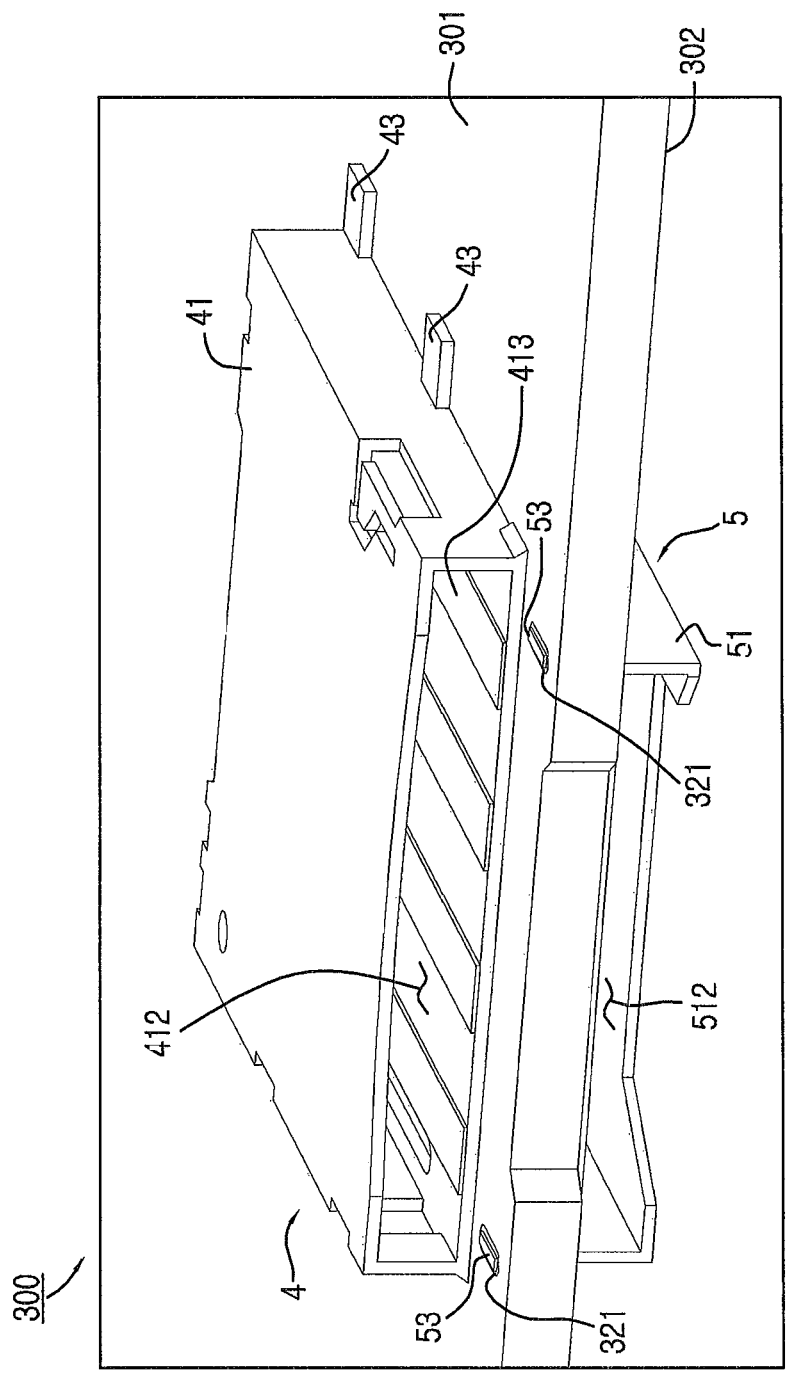
FIG. 4 illustrates a perspective view of sockets for memory cards coupled to a PCB according to an embodiment of the present disclosure.

FIG. 3 illustrates a perspective view of a PCB and sockets for memory cards separated according to an embodiment of the present disclosure, and FIG. 4 illustrates a perspective view of sockets for memory cards coupled to a PCB according to an embodiment of the present disclosure.

Referring to FIGS. 3 and 4, the PCB 300 is a substrate where a basic circuit and a plurality of electronic parts are mounted, sets an execution environment of the electronic device 100, maintains information thereof, stably drives the electronic device 100, and allows swift data input/output exchange of all devices of the electronic device 100. A battery (not shown) is electrically connected with the PCB 300, and may supply driving power of the electronic device 100. The electronic parts may be mounted on the PCB 300 or electrically connected to the PCB 300 by the medium of a cable and a Flexible Printed Circuit Board (FPCB).

A plurality of sockets 4 and 5 that may attach/detach a plurality of memory cards thereto may be mounted on the PCB 300. The PCB 300 may include a plurality of component holes 31 and 32 passing through an upper surface 301 and a lower surface 302. A land 321 for soldering (ex: copper foil pad) may be prepared in the neighborhood of openings of a plurality of component holes 31 and 32. The PCB 300 may include a plurality of lands 33 formed on the upper surface 301 and the lower surface 302. The plurality of sockets 4 and 5 may be mounted on the upper surface 301 and the lower surface 302 of the PCB 300, respectively. In the description below, the socket 4 mounted on the upper surface 301 of the PCB 300 is referred to as an upper socket, and the socket 5 mounted on the lower surface 302 of the PCB 300 is referred to as a lower socket. The upper socket 4 and the lower socket 5 may be used for attaching/detaching different memory cards, respectively. For example, the upper socket 4 may be used for a micro SIM card, and the lower socket 5 may be used for a micro SD card. The upper socket 4 and the lower socket 5 may be installed in an upper peripheral surface and a lower peripheral surface of the PCB 300, respectively, and may overlap at least partially. The upper socket 4 may include a body 41, a plurality of vertical leads 42, and a plurality of horizontal leads 43. The body 41 includes a receiving portion 412 having a rectangular shape generally and including an opening 411 open to one side, and a plurality of terminals 413 disposed on the inner bottom (portion contacting the upper surface 301 of the PCB 300) of the receiving portion 412. The plurality of vertical leads 42 and the plurality of horizontal leads 43 of the upper socket 4 may extend from the periphery of the bottom of the body 41 contacting the PCB 300. The vertical leads 42 of the upper socket 4 may be disposed to the side of the opening 411, and disposed in a pair facing each other around the opening 411. The body 41 of the upper socket 4 may be seated on the upper surface 301 of the PCB 300. The plurality of vertical leads 42 of the upper socket 4 may vertically extend from the body 41 to the lower direction of the PCB 300, and pass through the component hole 31 of the PCB 300. An end of the plurality of vertical leads 42 of the upper socket 4 may be exposed to a lower surface 302 of the PCB 300 via the component hole 31 of the PCB 300 and fixed to a land (ex: copper foil pad) prepared in the neighborhood of the opening of the component hole 31 via soldering. The plurality of horizontal leads 43 of the upper socket 4 may have a flat shape extending to the horizontal direction from the body 41, and be fixed to a plurality of lands 33 prepared on the upper surface 301 of the PCB 300 via soldering (ex: Surface Mounting Technology). A plurality of terminals 413 prepared on the inner bottom of the body 41 are electrically connected with a plurality of signal pads (44 of FIG. 5) extending to the rear (the opposite side of the opening) of the body 41, and the plurality of signal pads 44 may be electrically connected with lands (not shown) of the PCB 300 via soldering.

The lower socket 5 may include a body 51, a plurality of vertical leads 52, and a plurality of horizontal leads 53. The body 51 includes a receiving portion 512 having a rectangular shape generally and including an opening 511 open to one side, and a plurality of terminals 513 disposed on the inner bottom (portion contacting the upper surface 302 of the PCB 300) of the receiving portion 512. The plurality of vertical leads 52 and the plurality of horizontal leads 53 of the lower socket 5 may extend from the bottom of the body 51 contacting the PCB 300. The plurality of vertical leads 52 of the lower socket 5 may be disposed to the side of the opening 511, and disposed in a pair facing each other around the opening 511. The body 51 of the lower socket 5 may be seated on the lower surface 302 of the PCB 300. The plurality of vertical leads 52 of the lower socket 5 may extend from the body 51 to the upper direction of the PCB 300 and pass through the component hole 32 of the PCB 300. An end of the plurality of vertical leads 52 of the lower socket 5 may be exposed to an upper surface 301 of the PCB 300 via the component hole 32 of the PCB 300 and fixed to a plurality of lands 321 (ex: copper foil pad) prepared in the neighborhood of the opening of the component hole 32 via soldering. The plurality of horizontal leads 53 of the lower socket 5 may extend from the body 51 to the horizontal direction, and be fixed to lands (not shown) prepared on the lower surface 302 of the PCB 300 via soldering. A plurality of terminals 513 prepared on the inner bottom of the body 51 may be electrically connected with a plurality of signal pads 54 extending to the rear (the opposite side of the opening) of the body 51, and the plurality of signal pads 54 may be electrically connected with lands of the PCB 300 via soldering.

The plurality of vertical leads 42 and 52 may reinforce junction between the upper socket 4 and the lower socket 5, and the PCB 300. Since the plurality of vertical leads 42 and 52 are disposed to the side of the opening 411 of the upper socket 4 and the opening 511 of the lower socket 5, they may give strength to the plurality of openings 411 and 511. Since the plurality of vertical leads 42 and 52 pass through the component holes 31 and 32 (or DIP holes) of the PCB 300, and then are fixed to the PCB 300 via soldering, they may be called through hole leads or Dual Inline Package (DIP) pins.

The memory cards may be received in the receiving portions 412 and 512 of the sockets 4 and 5 via the plurality of openings 411 and 511, and terminals of the memory cards may electrically contact the plurality of terminals 413 and 513 of the sockets 4 and 5.

The one pair of component holes 31 of the PCB 300 through which the plurality of vertical leads 42 of the upper socket 4 pass may be disposed outside the one pair of the component holes 32 of the PCB 300 through which the plurality of vertical leads 52 of the lower socket 5 pass. The one pair of component holes 31 of the PCB 300 through which the plurality of vertical leads 42 of the upper socket 4 pass may be disposed at a position spaced further from the periphery 304 of the PCB 300 than the one pair of the component holes 32 of the PCB 300 through which the plurality of vertical leads 52 of the lower socket 5 pass. The one pair of component holes 31 of the PCB 300 through which the plurality of vertical leads 42 of the upper socket 4 pass may be disposed in the neighborhood of the bottom of the body 51 of the lower socket 5. The one pair of the component holes 32 of the PCB 300 through which the plurality of vertical leads 52 of the lower socket 5 pass may be disposed in the neighborhood of the bottom 41 of the upper socket 4. The upper socket 4 may be disposed to the inner side further from the periphery 304 on one side of the PCB 300 than the lower socket 5. The opening 411 of the upper socket 4 may be disposed at a position spaced further from the periphery 304 on one side of the PCB 300 than the opening 511 of the lower socket 5. A pair of soldered portions between the plurality of vertical leads 52 of the lower socket 5 and the land 321 of the component hole 32 of the PCB 300 may not protrude to the bottom of the upper socket 4. A soldered portion between the plurality of vertical leads 42 of the upper socket 4 and the PCB 300 may not interfere with the lower socket 5. A pair of soldered portions between the plurality of vertical leads 42 of the upper socket 4 and the land of the component hole 31 of the PCB 300 may be disposed at a wider interval than the lower socket 5 and may not protrude to the bottom of the lower socket 5. A soldered portion between the plurality of vertical leads 52 of the lower socket 5 and the PCB 300 may not interfere with the upper socket 4.

The upper socket 4 and the lower socket 5 may be a Surface Mount Device (SMD) type. The upper socket 4 and the lower socket 5 may be manufactured in one integrated socket in an integral type. For example, an integrated socket of a structure where one socket is stacked on another socket may be prepared, and the integrated socket may be mounted on the upper surface 301 and the lower surface 302 of the PCB 300. This integrated socket may include the above-described vertical leads or horizontal leads at a junction portion with the PCB 300. The central portion of the integrated socket is fit and fixed in a groove formed in the PCB 300, and the upper socket of the integrated socket may be disposed on the upper portion of the PCB 300 and the lower socket of the integrated socket may be disposed on the lower portion of the PCB 300.

Figure 5:
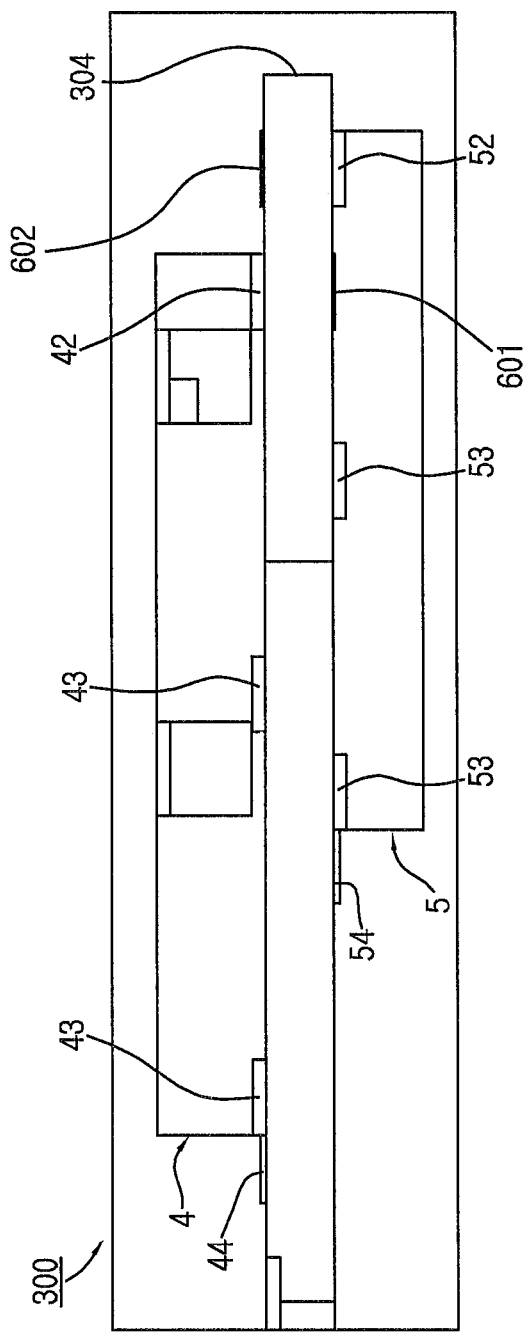
FIG. 5 illustrates a view of sockets for a memory card mounted on a PCB according to an embodiment of the present disclosure.

FIG. 5 illustrates a side view of sockets for a memory card mounted on a PCB according to an embodiment of the present disclosure.

Referring to FIG. 5, the upper socket 4 may be disposed to the inner portion further from the periphery 304 on one side of the PCB 300 than the lower socket 5. The opening 411 of the upper socket 4 may be disposed at a position spaced further from the periphery 304 on one side of the PCB 300 than the opening 511 of the lower socket 5. Since a coupling portion between the plurality of vertical leads 42 of the upper socket 4 and the component hole 31 of the PCB 300, that is, a soldered portion 601 does not overlap the lower socket 5, soldered portion 601 may not interfere with the lower socket 5. Since a soldered portion 602 between the plurality of vertical leads 52 of the lower socket 5 and the component hole 32 of the PCB 300 does not overlap the upper socket 4, soldered portion 602 may not interfere with the upper socket 4.

Figure 6:
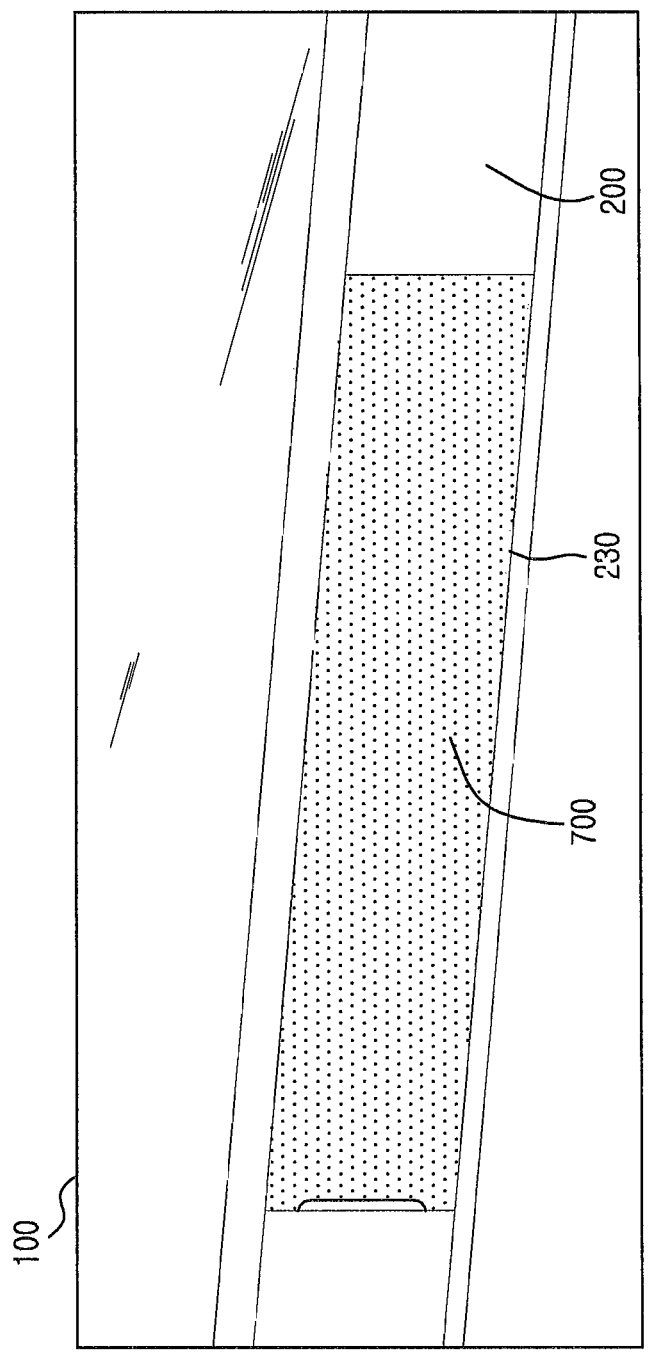
FIG. 6 illustrates a partial cross-sectional view of an electronic device according to an embodiment of the present disclosure.

FIG. 6 illustrates a partial cross-sectional view of an electronic device according to an embodiment of the present disclosure.

Referring to FIG. 6, the electronic device 100 may include a housing 200 forming an appearance, and a double cover 700 for opening/closing an opening 230 formed in the side portion of the housing 200. The double cover 700 is fit in the opening 230, and may not protrude with respect to the outer surface of the housing 200.

Figure 7:
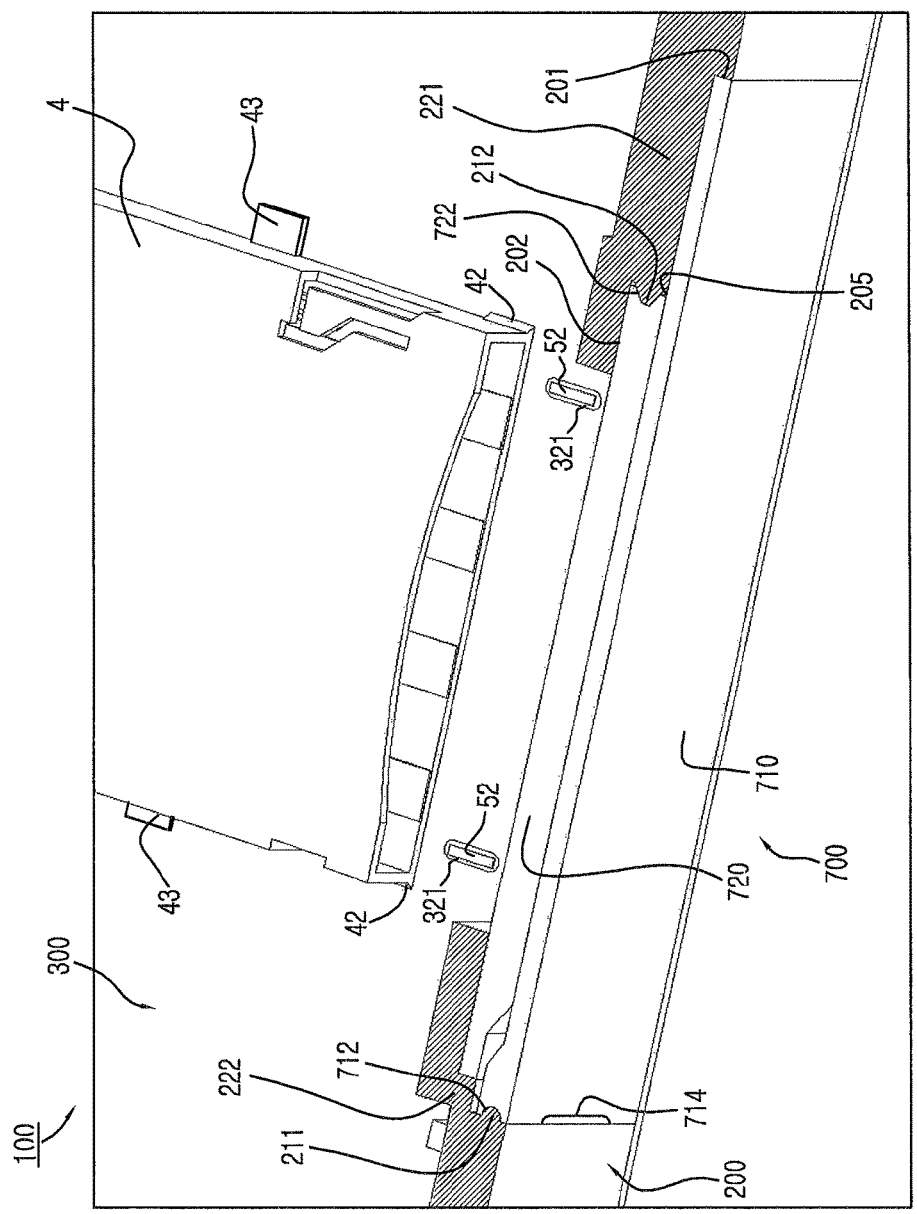
FIG. 7 illustrates a partial cross-sectional view of an electronic device according to an embodiment of the present disclosure.

FIG. 7 illustrates a partial cross-sectional view of an electronic device according to an embodiment of the present disclosure.

Referring to FIG. 7, the PCB 300 may mount the upper socket 4 and the lower socket 5 thereon, and may be mounted in an inner space of the housing 200.

The housing 200 may include an opening for communicating with the outside at a side portion adjacent to the upper socket 4 and the lower socket 5. The opening of the housing 200 may include an outer opening 201 and an inner opening 202. A protrusion 211 may be formed on the inner surface of the outer opening 201 of the housing 200. A protrusion 212 may be formed on the inner surface of the inner opening 202 of the housing 200.

The double cover 700 may include an outer cover 710 and an inner cover 720. The outer cover 710 has a shape that may be fit in the outer opening 201 of the housing 200, and is movable to open/close the outer opening 201 of the housing 200. The inner cover 720 has a shape that may be fit in the inner opening 202 of the housing 200, and is movable to open/close the inner opening 202 of the housing 200. As illustrated, in the case where the outer cover 710 and the inner cover 720 are not opened, the outer cover 710 and the inner cover 720 overlap each other, and only the outer cover 710 may be exposed to the outside. The outer cover 710 may include a groove 712 that may be fit to a protrusion 211 of the outer opening 201 of the housing 200 at the end of the outer cover 710. The inner cover 720 may include a groove 722 that may be fit to a protrusion 212 of the inner opening 202 of the housing 200 at the end of the inner cover 720.

The outer cover 710 may include a groove 714 on one side, and a user may draw out the outer cover 710 from the outer opening 201 of the housing 200 using this groove 714. A slit 205 exists between one end of the inner cover 720 and the inner opening 202 of the housing 200, and a user may draw out the inner cover 720 from the inner opening 202 of the housing 200 using this slit 205.

In the case only the outer cover 710 is opened, only the lower socket 5 may be used. In the case both the outer cover 710 and the inner cover 720 are opened, both the upper socket 4 and the lower socket 5 may be used.

Figure 8:
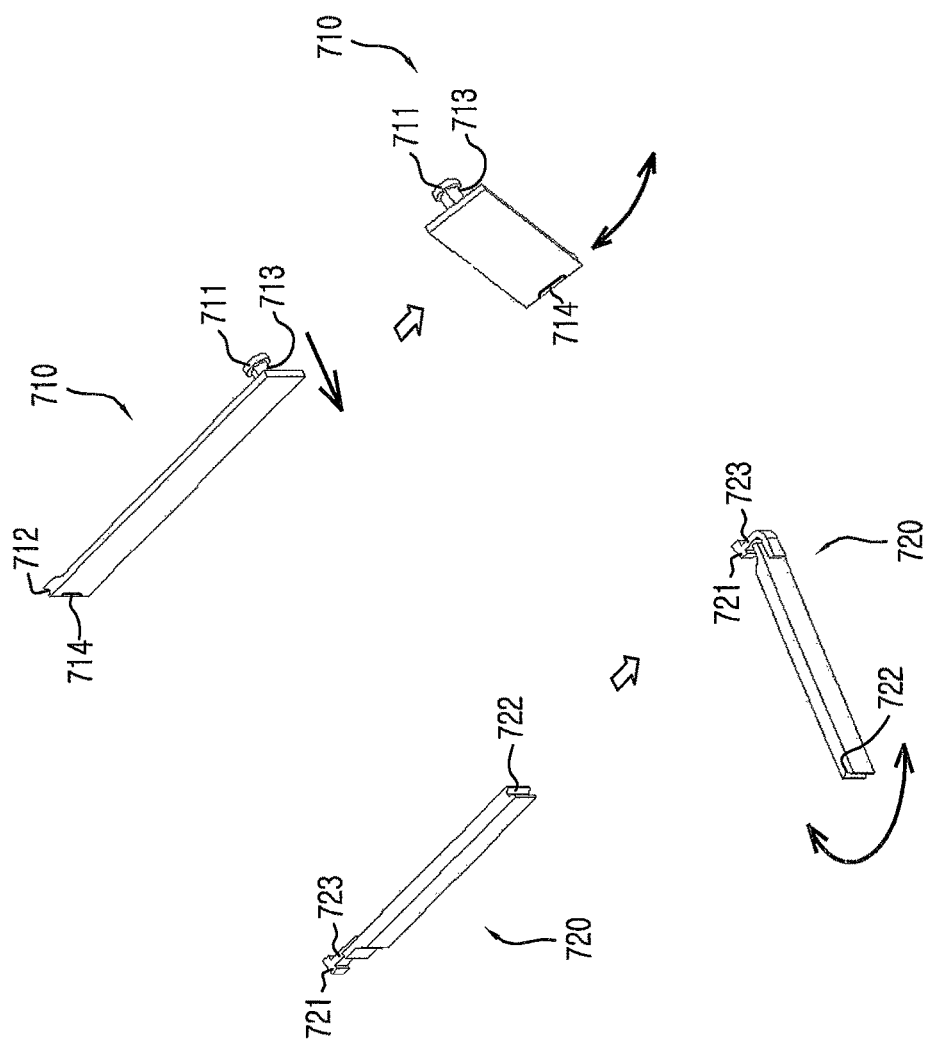
FIG. 8 illustrates a perspective view of an outer cover and an inner cover according to an embodiment of the present disclosure.

FIG. 8 illustrates a perspective view of an outer cover and an inner cover according to an embodiment of the present disclosure.

Referring to FIG. 8, the outer cover 710 may have a long plate shape generally. The groove 714 for user manipulation and the groove 712 that may be fit to the protrusion 211 of the outer opening 201 may be formed at one end of the outer cover 710. A shaft 713 vertically extending toward the inner direction of the housing 200 may be formed at the other end of the outer cover 710. The shaft 713 may include a hooking portion 711 extending to the radial direction from the end. The shaft 713 of the outer cover 710 may be fit in the groove formed in the housing 200, and the hooking portion 711 of the outer cover 710 may prevent the outer cover 710 from being detached from the groove. The outer cover 710 may slide and move to the outer direction of the housing 200 via the shaft 713, and then rotate around the shaft 713. The inner cover 720 may have a long plate shape generally. The groove 722 that may be fit to the protrusion 212 of the inner opening 202 of the housing 200 may be formed in one end of the inner cover 720. An extension portion 723 extending by a predetermined length may be formed at the other end of the inner cover 720. The extension portion 723 of the inner cover 720 may include a relatively thick hooking portion 721 at the end. The extension portion 723 of the inner cover 720 may be fit in the groove formed in the housing 200, and the hooking portion 721 of the inner cover 720 may prevent the inner cover 720 from being detached from the groove. The outer cover 710 and the inner cover 720 may rotate in directions perpendicular to each other. The hooking portion 721 of the inner cover 720 may prevent the inner cover 720 from being detached from the housing 200. The extension portion 723 of the inner cover 720 may include ductility and elasticity. The inner cover 720 may be opened via bending (elastic warp deformation) of the extension portion 723.

Figure 10:
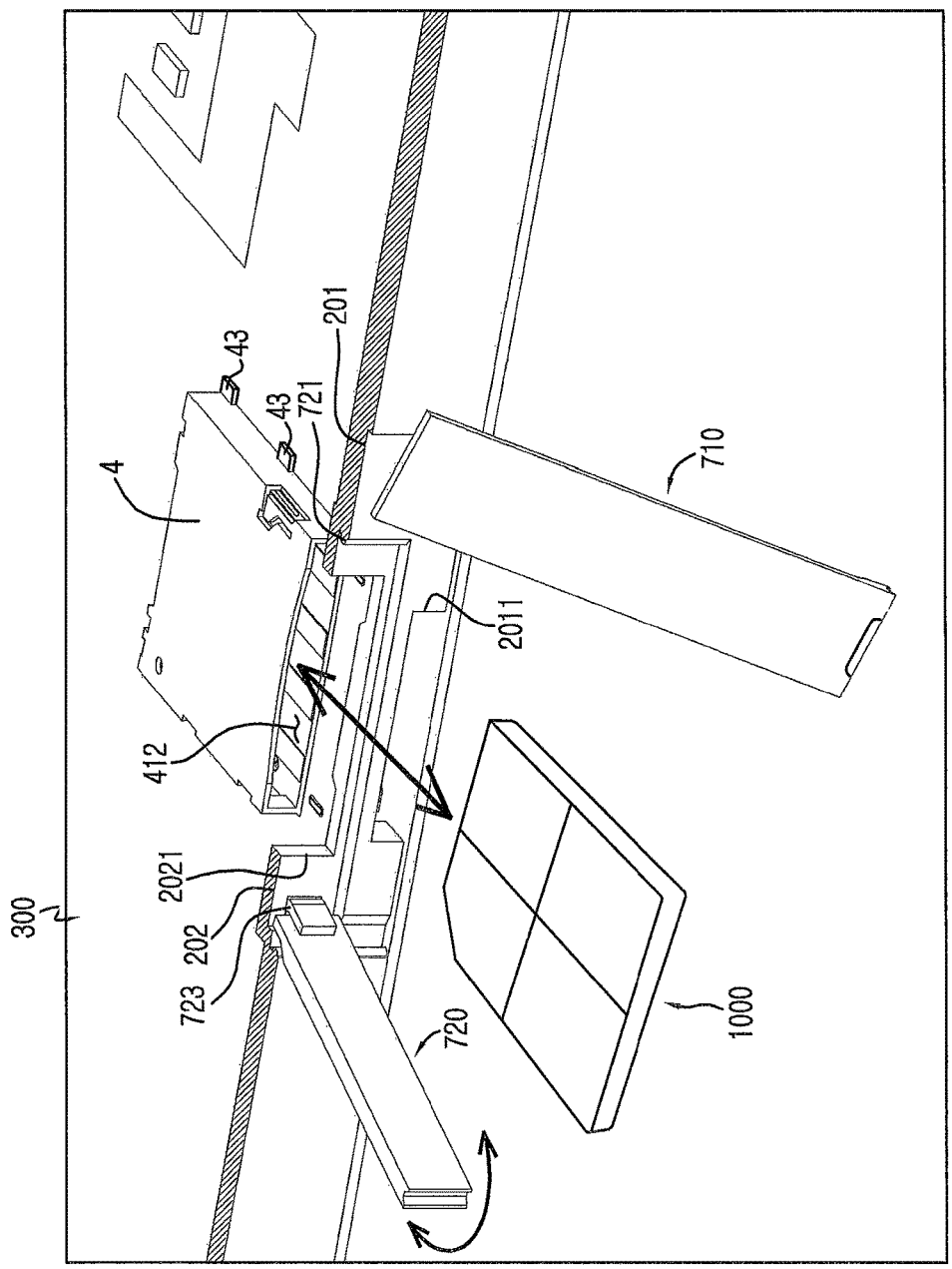
FIG. 10 illustrates a partial cross-sectional view of an open state of both an outer cover and an inner cover according to an embodiment of the present disclosure.

The extension portion 723 of the inner cover 720 may be disposed in the left of an upper slot (2021 of FIG. 10), and the shaft 713 of the outer cover 710 may be disposed in the right of a lower slot (2011 of FIG. 10).

Figure 9:
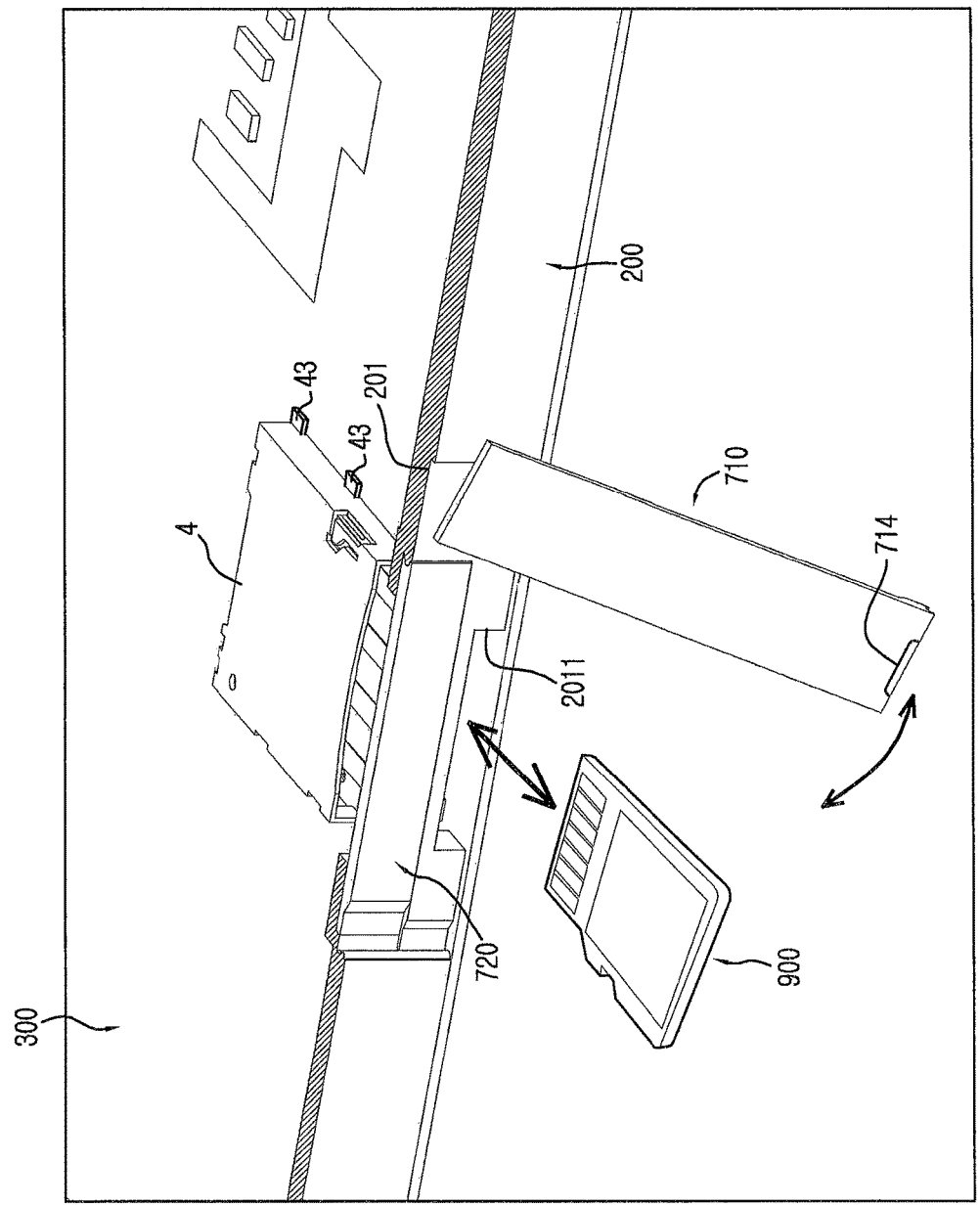
FIG. 9 illustrates a partial cross-sectional view of an open state of an outer cover according to an embodiment of the present disclosure.

FIG. 9 illustrates a partial cross-sectional view of an open state of an outer cover according to an embodiment of the present disclosure.

Referring to FIG. 9, in the case where a user takes and pulls one side of the outer cover 710 using the groove 714, the outer cover 710 may slide and move to the outer direction using the shaft 713. The user may rotate the moved outer cover 710 around the shaft 713 such that outer cover 710 may cross the side portion of the housing 200. The outer opening 201 of the housing 200 may include the lower slot 2011 that communicates with the receiving portion 512 of the lower socket 5. In the case where the outer cover 710 is opened and the outer opening 201 of the housing 200 is opened, the user may attach/detach a memory card 900 (ex: an SD card) to/from the receiving portion 512 of the lower socket 5 via the lower slot 2011.

FIG. 10 illustrates a partial cross-sectional view of an open state of both an outer cover and an inner cover according to an embodiment of the present disclosure.

Referring to FIG. 10, in the case where a user pulls one side of the inner cover 720 using the slit 205 with the outer cover 710 opened, the inner cover 720 may be opened using bending of the extension portion 723. The inner opening 202 of the housing 200 may include the upper slot 2021 that communicates with the receiving portion 412 of the upper socket 4. The user may attach/detach a memory card 1000 (ex: a SIM card) to/from the receiving portion 412 of the upper socket 4 via the upper slot 2021.

The outer cover 710 and the inner cover 720 may have different colors, respectively. For example, the outer cover 710 may be a fluorescent color and the inner cover 720 may be a red color. A character (ex: "SIM CARD", "SD CARD") informing of attachment/detachment of a specific memory card may be imprinted or marked on the outer surface of the outer cover 710 and the inner cover 720. The user may use a correct cover for attachment/detachment of a relevant memory card based on the color or the character of the cover.

A use rate of the lower socket 5 corresponding to the outer cover 710 may be greater than that of the upper socket 4 corresponding to the inner cover 720.

Figure 11:
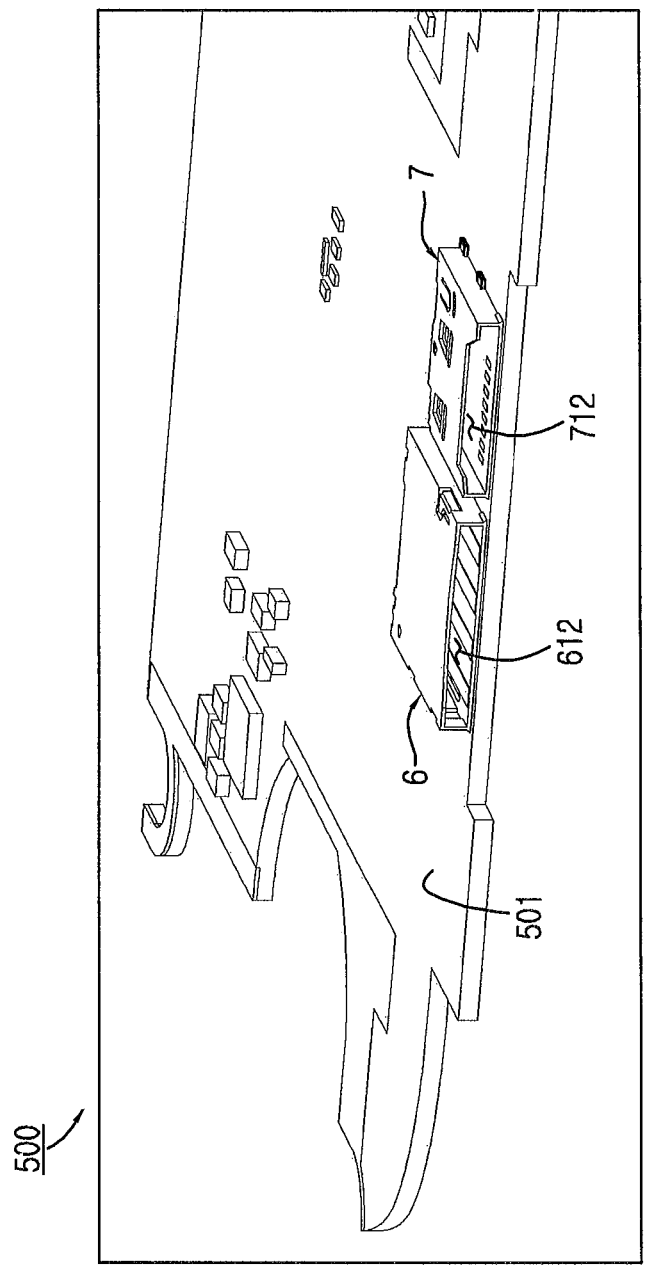
FIG. 11 illustrates a perspective view of a PCB according to an embodiment of the present disclosure.

FIG. 11 illustrates a perspective view of a PCB according to an embodiment of the present disclosure.

Referring to FIG. 11, the PCB 500 is a substrate where a basic circuit and a plurality of electronic parts are mounted, sets an execution environment of the electronic device 100, maintains information thereof, stably drives the electronic device 100, and allows swift data input/output exchange of all devices of the electronic device 100.

A plurality of sockets 6 and 7 for attaching/detaching a plurality of memory cards may be mounted on the PCB 500. The plurality of sockets 6 and 7 may be disposed side by side on an upper surface 501 in the neighborhood of the periphery of the PCB 500. A left socket 6 may be for a micro SIM card, and a right socket 7 may be for a micro SD card. The left socket 6 and the right socket 7 may be a DIP type or an SMD type. The left socket 6 and the right socket 7 may be manufactured in an integral type. For example, an integrated socket of a structure where one socket is coupled to another socket may be provided, and the integrated socket may be mounted on the upper surface 501 or the lower surface 502 of the PCB 500. The vertical leads or horizontal leads may be formed on a junction portion between this integrated socket and the PCB 500.

Figure 12:
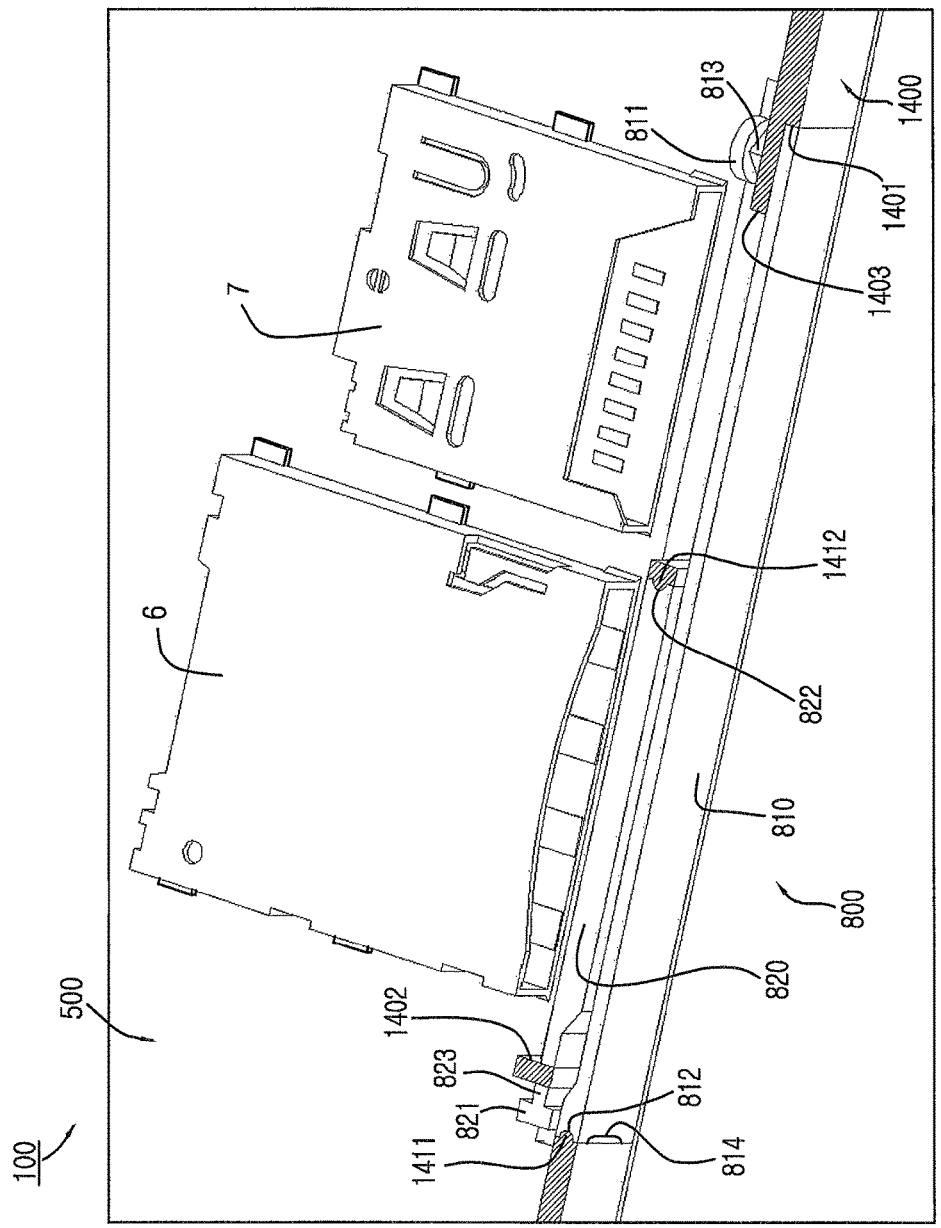
FIG. 12 illustrates a partial cross-sectional view of an electronic device according to an embodiment of the present disclosure.

FIG. 12 illustrates a partial cross-sectional view of an electronic device according to an embodiment of the present disclosure.

Referring to FIG. 12, the electronic device 100 may include a housing 1400 forming an appearance, and include a double cover 800 for opening/closing an opening formed in the side portion of the housing 1400. The double cover 800 may be fit in the opening, and may not protrude with respect to the outer surface of the housing 1400.

The PCB 500 may mount a left socket 6 and a right socket 7 thereon and be mounted in an inner space of the housing 1400. The housing 1400 may include an opening for communicating with the left socket 6 and the right socket 7 in the side portion of the housing 1400. The opening of the housing 1400 may include an outer opening 1401, a left inner opening 1402, and a right inner opening 1403. The left inner opening 1402 and the right inner opening 1403 branch from the outer opening 1401, and may communicate with the outer opening 1401. The left inner opening 1402 may communicate with a receiving portion 612 of the left socket 6. The right inner opening 1403 may communicate with a receiving portion 712 of the right socket 7. A protrusion 1411 may be formed on the inner surface of the outer opening 1401 of the housing 1400. A protrusion 1412 may be formed on the inner surface of the left inner opening 1402 of the housing 1400.

The double cover 800 may include an outer cover 810 and an inner cover 820. The outer cover 810 has a shape that may be fit in the outer opening 1401 of the housing 1400, and is movable for opening/closing the outer opening 1401 of the housing 1400. The inner cover 820 has a shape that may be fit in the left inner opening 1402 of the housing 1400, and is movable for opening/closing the left inner opening 1402 of the housing 1400. As illustrated, in the case where the outer cover 810 and the inner cover 820 are not opened, the outer cover 810 and the inner cover 820 overlap each other, and only the outer cover 810 may be exposed to the outside. The outer cover 810 may include a groove 1412 in which the protrusion 1411 of the outer cover 1401 of the housing 1400 may be fit at the end. The inner cover 820 may include a groove 822 in which the protrusion 1412 of the left inner opening 1402 may be fit in the end. The outer cover 810 may include a groove 814 in one side, and a user may draw out the outer cover 810 from the outer opening 1401 of the housing 1400 using the groove 814. The inner cover 820 may include a groove (824 of FIG. 13) in one side, and the user may draw the inner cover 810 from the left inner opening 1402 using this groove 824.

The outer cover 810 may have a long plate shape generally. The groove 814 for user manipulation and the groove 812 in which the protrusion 1411 of the outer opening 1401 of the housing 1400 may be fit may be formed in one end of the outer cover 810. A shaft 813 vertically extending in the inner direction of the housing 1400 may be formed on the other end of the outer cover 810. The shaft 813 may include a hooking portion 811 extending in the radial direction from the end. The shaft 813 of the outer cover 810 may be fit in the groove formed in the housing 1400, and the hooking portion 811 of the outer cover 810 may prevent the outer cover 810 from being detached from the groove. The hooking portion 811 of the outer cover 810 may prevent the outer cover 810 from being detached from the housing 1400. The outer cover 810 may slide and move to the outer direction of the housing 1400 via the shaft 813, and then rotate around the shaft 813.

The inner cover 820 may have a long plate shape generally. A groove 822 in which the protrusion 1412 of the left inner opening 1402 of the housing 1400 may be fit may be formed in one end of the inner cover 820. An extension portion 823 extending by a predetermined length may be formed on the other end of the inner cover 820. The extension portion 823 of the inner cover 820 may include a relatively thick hooking portion 821 at the. The extension portion 823 of the inner cover 820 may be fit in the groove formed in the housing 1400, and the hooking portion 821 of the inner cover 820 may prevent the inner cover 820 from being detached from the groove. The extension portion 823 of the inner cover 820 may have ductility and elasticity. The inner cover 820 may be opened via bending of the extension portion 823.

In the case where only the outer cover 810 is opened, only the right socket 7 may be used. In the case where both the outer cover 810 and the inner cover 820 are opened, the left socket 6 and the right socket 7 may be used.

Figure 13:
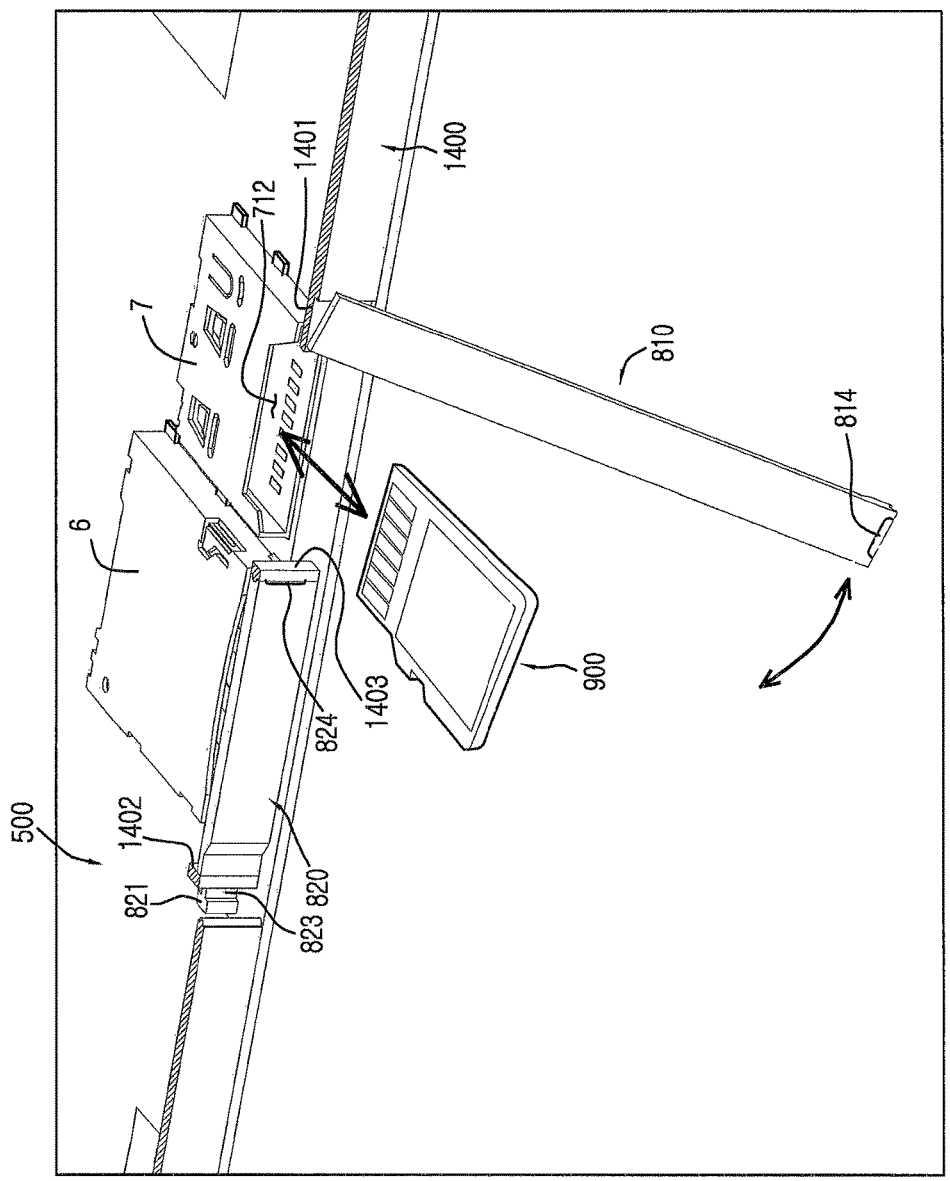
FIG. 13 illustrates a partial cross-sectional view of an open state of an outer cover according to an embodiment of the present disclosure.

FIG. 13 illustrates is a partial cross-sectional view of an open state of an outer cover according to an embodiment of the present disclosure.

Referring to FIG. 13, in the case where a user pulls one side of the outer cover 810 using the groove 814, the outer cover 810 may slide and move to the outer direction using the shaft 813. The user may rotate the moved outer cover 810 around the shaft 813 such that outer cover 810 may cross the side portion of the housing 1400. In the case where the outer cover 810 is opened, the right inner opening 1403 that communicates with the outer opening 1401 of the housing 1400 is open, and the user may attach/detach the memory card 900 to/from a receiving portion 712 of the right socket 7 via the right inner opening 1403.

Figure 14:
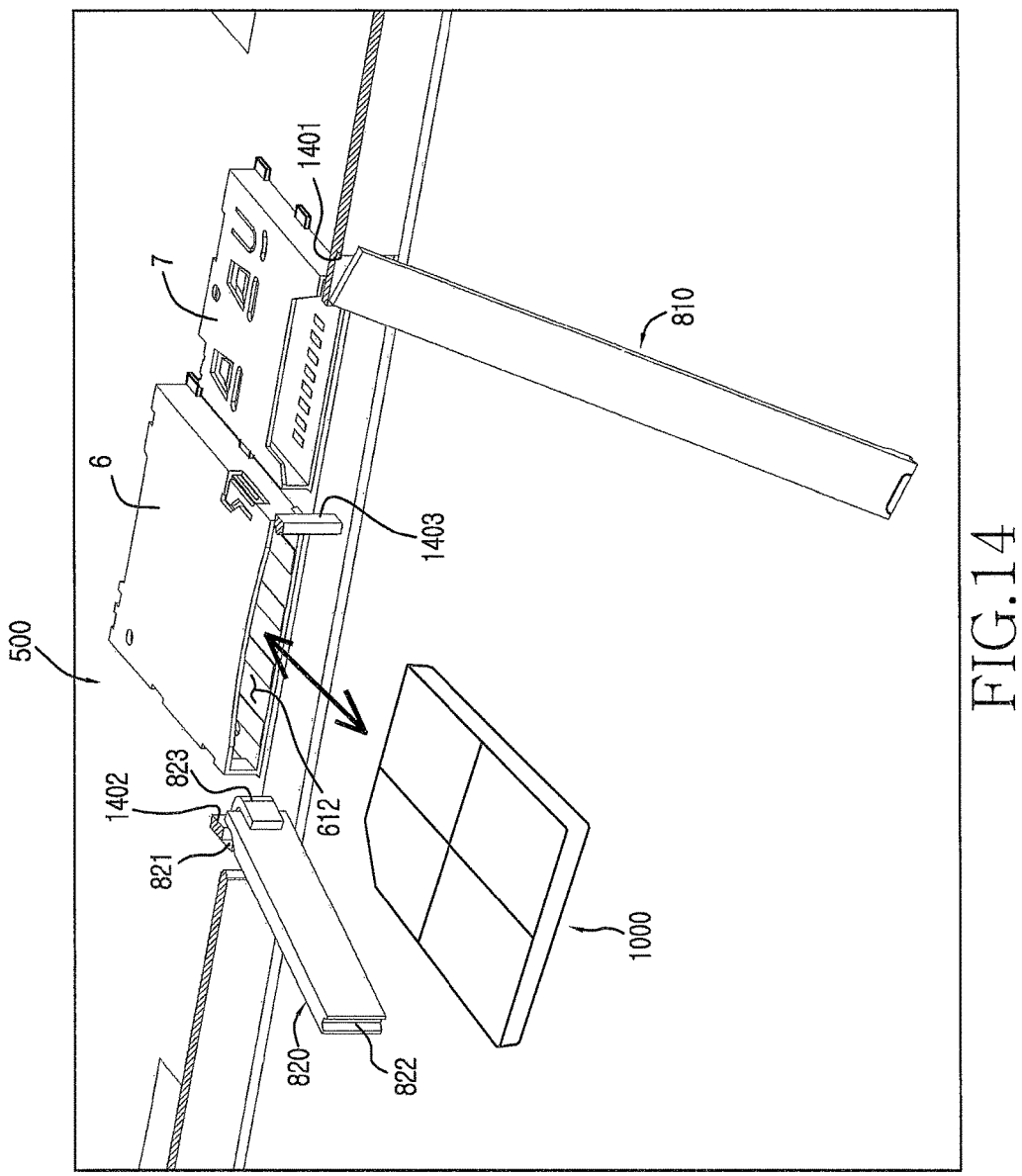
FIG. 14 illustrates a partial cross-sectional view of an open state of both an outer cover and an inner cover according to an embodiment of the present disclosure.

FIG. 14 illustrates a partial cross-sectional view of an open state of both an outer cover and an inner cover according to an embodiment of the present disclosure.

Referring to FIG. 14, in the case where a user pulls one side of the inner cover 820 using the groove (824 of FIG. 13) with the outer cover 810 opened, the inner cover 820 may be opened via bending of the extension portion 823. In the case where the inner cover 820 is opened, the left inner opening 1402 that communicates with the outer opening 1401 of the housing 1400 is open, and the user may attach/detach the memory card 1000 to/from a receiving portion 612 of the left socket 6 via the left inner opening 1402.

According to an embodiment of the present disclosure, the electronic device 100 may include a PCB 300 mounting a first socket (ex: the upper socket 4) and a second socket (ex: the lower socket 5) thereon, a first slot (ex: the upper slot 2021) disposed to correspond to the first socket (ex: the upper socket 4), a second slot (ex: the lower slot 2011) disposed to correspond to the second socket (ex: the lower socket 5), a housing 200 for receiving the PCB, an inner cover 720 for opening/closing the first slot (ex: the upper slot 2021), and an outer cover 710 for opening/closing the second slot (ex: the lower slot 2011). The first socket (ex: the upper socket 4) and the second socket (ex: the lower socket 5) may be open toward the first slot (ex: the upper slot 2021) and the second slot (ex: the lower slot 2011), respectively. In the case where the outer cover 710 is opened, the inner cover 720 may be exposed and become an openable state.

According to an embodiment of the present disclosure, in the case where both the inner cover 720 and the outer cover 710 are closed, the outer cover 710 may overlap the inner cover 720 and hide the inner cover 720.

According to an embodiment of the present disclosure, the first socket (ex: the upper socket 4) and the second socket (ex: the lower socket 5) may be disposed on an upper surface 301 and a lower surface 302 in the neighborhood 304 of the PCB 300, respectively.

According to an embodiment of the present disclosure, the first socket (ex: the upper socket 4) and the second socket (ex: the lower socket 5) may overlap each other at least partially by the medium of the PCB 300.

According to an embodiment of the present disclosure, an opening 411 of the first socket (ex: the upper socket 4) may be disposed at a position spaced further from a periphery 304 of the PCB 300 than an opening 511 of the second socket (ex: the lower socket 5).

According to an embodiment of the present disclosure, the first socket (ex: the upper socket 4) may include at least one vertical first lead 42 that vertically extends from a bottom contacting the upper surface 301 of the PCB 300 to the lower direction to pass through the PCB 300 and is fixed to the PCB 300 via soldering. The second socket (ex: the lower socket 5) may include at least one vertical second lead 52 that vertically extends from the bottom contacting the lower surface 302 of the PCB 300 to the upper direction to pass through the PCB 300, and is fixed to the PCB 300 via soldering. The PCB 300 may include a first component hole 31 including a land through which the at least one vertical first lead 42 passes and which is designed for soldering with the at least one vertical first lead at the lower opening. The PCB 300 may include a second component hole 32 including a land 321 through which the at least one vertical second lead 52 pass and which is designed for soldering with the at least one vertical second lead at the upper opening.

According to an embodiment of the present disclosure, the first component hole 31 may be disposed in the neighborhood of the bottom of the second socket (ex: the lower socket 5), and the second component hole 32 may be disposed in the neighborhood of the bottom of the first socket (ex: the upper socket 4).

According to an embodiment of the present disclosure, the at least one vertical first lead 42 may be disposed on the side of the opening 411 of the first socket (ex: the upper socket 4), and the at least one vertical second lead 52 may be disposed on the side of the opening 511 of the second socket (ex: the lower socket 5).

According to an embodiment of the present disclosure, each of the first component hole 31 and the second component hole 32 may be disposed in one pair.

According to an embodiment of the present disclosure, the first socket (ex: the upper socket 4) may include at least one first horizontal lead 43 extending to the horizontal direction from the bottom contacting the upper surface 301 of the PCB 300 and fixed to the PCB 300 via soldering. The second socket (ex: the lower socket 5) may include at least one second horizontal lead 53 extending to the horizontal direction from the bottom contacting the lower surface 302 of the PCB 300 and fixed to the PCB 300 via soldering. The PCB 300 may include a first pad 33 for soldering with the at least one horizontal lead 43 on the upper surface 301. The PCB 300 may include a second pad 33 for soldering with the at least one second horizontal lead 53 on the lower surface 302.

According to an embodiment of the present disclosure, the first socket (ex: the upper socket 4) and the second socket (ex: the lower socket 5) may be manufactured in an integral type.

According to an embodiment of the present disclosure, the first socket (ex: the left socket 6) and the second socket (ex: the right socket 7) may be disposed on one of the upper surface 501 and the lower surface 502 in the neighborhood of the periphery of the PCB 500.

According to an embodiment of the present disclosure, the first socket (ex: the upper socket 4) and the second socket (ex: the lower socket 5) may be used for attaching/detaching different memory cards, respectively.

According to an embodiment of the present disclosure, the inner cover 720 and the outer cover 710 may be rotatable around one end coupled to the housing 200.

According to an embodiment of the present disclosure, the inner cover 720 and the outer cover 710 may be rotatable in directions perpendicular to each other, respectively.

According to an embodiment of the present disclosure, the outer cover 710 is movable in a straight line by a predetermined distance to the outer direction of the housing 200 via sliding movement of the shaft 713 coupled to the housing 200, and may be rotatable around the shaft 713 such that outer cover 710 may cross the side portion of the housing 200.

According to an embodiment of the present disclosure, the inner cover 720 may rotate to the outer direction of the housing 200 by elastic warp deformation of the extension portion 723 coupled to the housing 200.

According to an embodiment of the present disclosure, the extension portion 723 of the inner cover 720 may be disposed in the left of the first slot (ex: the upper slot 2021), and the shaft 713 of the outer cover 710 may be disposed in the right of the second slot (ex: the lower slot 2011).

According to an embodiment of the present disclosure, the housing 200 may include a first opening (ex: the inner opening 202) communicating with the first slot (ex: the upper slot 2021), and a second opening (ex: the outer opening 201) extending from the first opening and communicating with the second slot (ex: the lower slot 2011). The inner cover 720 may be fit in the first opening (ex: the inner opening 202) to close the first slot (ex: the upper slot 2021). The outer cover 710 may be fit in the second opening (ex: the outer opening 201) to form an appearance of the electronic device 100.

Although the disclosure has been shown and described with reference to certain exemplary embodiments thereof, it will be understood by those skilled in the art that various changes in form and details may be made therein without departing from the spirit and scope of the disclosure as defined by the appended claims and their equivalents. Therefore, the scope of the present disclosure should not be limited to the above-described embodiments but should be determined by not only the appended claims but also the equivalents thereof.

What is claimed is:

1. An electronic device comprising:
   a Printed Circuit Board (PCB) having mounted thereon a first socket and a second socket;
   a housing comprising a first slot disposed to correspond to the first socket and a second slot disposed to correspond to the second socket, and configured to cover at least a portion of the PCB;
   an inner cover configured to cover the first slot when the inner cover is in a closed state and allow access to the first slot when the inner cover is in an open state; and
   an outer cover configured to cover at least the second slot,
   wherein the first socket and the second socket each have an opening toward the first slot and the second slot, respectively, and when the outer cover is open, the inner cover is exposed and is in an openable state,
   wherein the openable state comprises a state in which the inner cover can be transitioned between the closed state to deny access to the first slot and the open state to allow access to the first slot,
   wherein the inner cover and the outer cover are rotatable in directions perpendicular to each other, respectively.

2. The electronic device of claim 1, wherein when both the inner cover and the outer cover are closed, the outer cover overlaps the inner cover and hides the inner cover.

3. The electronic device of claim 1, wherein the first socket and the second socket are disposed on an upper surface and a lower surface, respectively, proximately to a periphery of the PCB.

4. The electronic device of claim 3, wherein the first socket and the second socket overlap each other at least partially by a medium of the PCB.

5. An electronic device comprising:
   a Printed Circuit Board (PCB) having mounted thereon a first socket and a second socket;
   a housing comprising a first slot disposed to correspond to the first socket and a second slot disposed to correspond to the second socket, and configured to cover at least a portion of the PCB;
   an inner cover configured to cover the first slot; and
   an outer cover configured to cover at least the second slot,
   wherein the first socket and the second socket each have an opening toward the first slot and the second slot, respectively, and when the outer cover is open, the inner cover is exposed and is in an openable state,
   wherein the first socket and the second socket are disposed on an upper surface and a lower surface, respectively, proximately to a periphery of the PCB,
   wherein the first socket and the second socket overlap each other at least partially by a medium of the PCB,
   wherein the opening of the first socket is disposed in a position spaced further from the periphery of the PCB than the opening of the second socket,
   wherein the first socket comprises at least one first vertical lead extending vertically from a bottom contacting the upper surface of the PCB to a lower direction to pass through the PCB and is fixed to the PCB via soldering,
   wherein the second socket comprises at least one second vertical lead extending vertically from a bottom contacting the lower surface of the PCB to an upper direction to pass through the PCB and is fixed to the PCB via soldering,
   wherein the PCB comprises a first component hole through which the at least one first vertical lead passes and that comprises a land for soldering with the at least one first vertical lead, and
   wherein the PCB comprises a second component hole through which the at least one second vertical lead passes and that comprises a land for soldering with the at least one second vertical lead.

6. The electronic device of claim 5, wherein the first component hole is disposed in proximity to a bottom of the second socket, and the second component hole is disposed in proximity to a bottom of the first socket.

7. The electronic device of claim 6, wherein the at least one first vertical lead is disposed in a side of the opening of the first socket, and the at least one second vertical lead is disposed in a side of the opening of the second socket.

8. The electronic device of claim 7, wherein each of the first component hole and the second component hole is disposed in a pair.

9. The electronic device of claim 5, wherein:
the first socket comprises at least one first horizontal lead extending in a horizontal direction from a bottom contacting the upper surface of the PCB and is fixed to the PCB via soldering,
the second socket comprises at least one second horizontal lead extending in a horizontal direction from a bottom contacting the lower surface of the PCB and is fixed to the PCB via soldering,
the PCB comprises a first pad for soldering with the at least one first horizontal lead on the upper surface, and
the PCB comprises a second pad for soldering with the at least one second horizontal lead on the lower surface.

10. The electronic device of claim 1, wherein the first socket and the second socket are manufactured in an integral type.

11. The electronic device of claim 1, wherein the first socket and the second socket are configured to receive different memory cards, respectively.

12. The electronic device of claim 1, wherein the inner cover and the outer cover are rotatable around one end coupled to the housing.

13. The electronic device of claim 1, wherein the outer cover is movable in a straight line by a predetermined distance to an outer direction of the housing by sliding movement of a shaft coupled to the housing and is movable around the shaft such that the outer cover crosses a side portion of the housing.

14. The electronic device of claim 13, wherein the inner cover is movable to the outer direction of the housing by elastic warp deformation of an extension portion coupled to the housing.

15. The electronic device of claim 14, wherein an extension portion of the inner cover is disposed to a left side of the first slot, and a shaft of the outer cover is disposed to a right side of the second slot.

16. The electronic device of claim 1, wherein:
the housing comprises a first opening configured to provide access to the opening of the first slot, and a second opening extending from the first opening and configured to provide access to the opening of the second slot,
the inner cover is configured to fit in the first opening to close the first slot, and
the outer cover is configured to fit in the second opening to form an outer appearance of the electronic device.

17. An electronic device comprising:
a Printed Circuit Board (PCB) having mounted thereon an upper socket and a lower socket of different types on an upper surface and a lower surface, respectively, and in proximity to a periphery;
a housing comprising an upper slot disposed to correspond to the upper socket and a lower slot disposed to correspond to the lower socket in a lateral portion, the housing configured to cover at least a portion of the PCB;
an inner cover rotatable to an outer direction of the housing using elastic warp deformation of an extension portion coupled to the housing, the inner cover configured to cover the upper slot; and
an outer cover movable in a straight line by a predetermined distance to an outer direction of the housing by sliding movement of a shaft coupled to the housing, the outer cover rotatable around the shaft such that the outer cover crosses a lateral portion of the housing, the outer cover configured to cover at least the lower slot,
wherein the upper socket and the lower socket each have an opening toward the upper slot and the lower slot, respectively, when both the inner cover and the outer cover are closed, the outer cover overlaps the inner cover and hides the inner cover, and when where the outer cover is opened, the inner cover is exposed and is in an openable state.

* * * * *